United States Patent
Xiao et al.

(10) Patent No.: US 9,054,021 B2
(45) Date of Patent: Jun. 9, 2015

(54) TRANSISTORS AND FABRICATION METHOD

(71) Applicant: Semiconductor Manufacturing International Corp., Shanghai (CN)

(72) Inventors: Deyuan Xiao, Shanghai (CN); Emily Shu, Shanghai (CN)

(73) Assignee: SEMICONDUCTOR MANUFACTURING INTERNATIONAL CORP, Shanghai (CN)

( * ) Notice: Subject to any disclaimer, the term of this patent is extended or adjusted under 35 U.S.C. 154(b) by 0 days.

(21) Appl. No.: 13/832,933

(22) Filed: Mar. 15, 2013

(65) Prior Publication Data
US 2014/0145269 A1    May 29, 2014

(30) Foreign Application Priority Data

Nov. 27, 2012   (CN) .......................... 2012 1 0492206

(51) Int. Cl.
*H01L 29/16* (2006.01)
*H01L 29/49* (2006.01)
*H01L 29/786* (2006.01)
*H01L 29/04* (2006.01)

(52) U.S. Cl.
CPC ........ *H01L 29/1606* (2013.01); *H01L 29/4908* (2013.01); *H01L 29/78603* (2013.01); *H01L 29/78648* (2013.01); *H01L 29/78654* (2013.01); *H01L 29/78696* (2013.01); *H01L 29/045* (2013.01)

(58) Field of Classification Search
CPC ................ H01L 21/02491; H01L 21/02527; H01L 29/1606; H01L 29/66772; H01L 29/78654; H01L 2224/32145; H01L 2924/10253; H01L 51/0045; H01L 29/04; H01L 29/1075; H01L 29/42384; H01L 29/4908; H01L 29/66742; H01L 51/0023; H01L 51/0048; H01L 51/0545; H01L 51/055; H01L 29/045; H01L 29/78603; H01L 29/78648; H01L 29/78696; B82Y 30/00; B82Y 40/00; C01B 31/0461
See application file for complete search history.

(56) References Cited

U.S. PATENT DOCUMENTS

| | | | |
|---|---|---|---|
| 6,646,307 B1 * | 11/2003 | Yu et al. ........................ | 257/347 |
| 8,673,703 B2 * | 3/2014 | Lin et al. ...................... | 438/164 |
| 2008/0164528 A1 * | 7/2008 | Cohen et al. ................. | 257/365 |
| 2009/0011592 A1 * | 1/2009 | Uno et al. ..................... | 438/623 |
| 2010/0025660 A1 * | 2/2010 | Jain et al. ....................... | 257/24 |
| 2010/0200839 A1 * | 8/2010 | Okai et al. ..................... | 257/29 |

(Continued)

OTHER PUBLICATIONS

Jose et al., Structures and electronic properties of silicene clusters: a promising material for FET and hydrogen storage, Phys. Chem. Chem. Phys., 2011, 13, 7304-7311.*

(Continued)

*Primary Examiner* — Bac Au
*Assistant Examiner* — Sophia Nguyen
(74) *Attorney, Agent, or Firm* — Anova Law Group, PLLC

(57) ABSTRACT

A method is provided for fabricating a transistor. The method includes providing a semiconductor substrate, and forming a metal layer on the semiconductor substrate. The method also includes forming a silicon layer having at least one layer of graphene-like silicon on the metal layer, and forming a metal oxide layer by oxidizing a portion of the metal layer underneath the silicon layer. Further, the method includes forming a source region and a drain region connecting with the silicon layer.

20 Claims, 4 Drawing Sheets

(56) References Cited

U.S. PATENT DOCUMENTS

| | | | | |
|---|---|---|---|---|
| 2010/0213518 | A1* | 8/2010 | Wu et al. | 257/288 |
| 2010/0214012 | A1* | 8/2010 | Raza | 327/537 |
| 2010/0297398 | A1* | 11/2010 | Sarma et al. | 428/156 |
| 2011/0017979 | A1* | 1/2011 | Meric et al. | 257/29 |
| 2011/0278730 | A1* | 11/2011 | Naujok et al. | 257/773 |
| 2012/0074387 | A1* | 3/2012 | King | 257/29 |
| 2012/0138903 | A1* | 6/2012 | Chung et al. | 257/29 |
| 2012/0161098 | A1* | 6/2012 | Hiura et al. | 257/9 |
| 2012/0168721 | A1* | 7/2012 | Kelber et al. | 257/29 |
| 2012/0248416 | A1* | 10/2012 | Zhou et al. | 257/29 |
| 2012/0288433 | A1* | 11/2012 | Sutter et al. | 423/445 B |
| 2012/0326126 | A1* | 12/2012 | Chen et al. | 257/29 |
| 2013/0193411 | A1* | 8/2013 | Lee et al. | 257/29 |
| 2013/0313524 | A1* | 11/2013 | De Micheli et al. | 257/29 |
| 2013/0330849 | A1* | 12/2013 | Zhu et al. | 438/22 |
| 2013/0330885 | A1* | 12/2013 | Chen et al. | 438/151 |

OTHER PUBLICATIONS

Gao et al., Initial geometries, interaction mechanism and high stability of silicene on Ag(111) surface, 2012, Scientific Reports, pp. 1-8.*

Jamgotchian et al., Growth of silicene layers on Ag(111): unexpected effect of the substrate temperature, 2012, J. Phys.: Condens. Matter 24 172001 (7pp).*

Houssa et al., Can silicon behave like graphene? A first-principles study, 2010, Applied Physics Letters 97, 112106.*

Kara et al., A review on silicene—New candidate for electronics, 2012, Surface Science Reports 67, 1-18.*

Enriquez et al., Silicene structures on silver surfaces, 2012, J. Phys.: Condens. Matter 24, 314211 (7pp).*

* cited by examiner

US 9,054,021 B2

TRANSISTORS AND FABRICATION METHOD

CROSS-REFERENCES TO RELATED APPLICATIONS

This application claims the priority of Chinese patent application No. 201210492206.1, filed on Nov. 27, 2012, the entirety of which is incorporated herein by reference.

FIELD OF THE INVENTION

The present invention generally relates to the field of semiconductor manufacturing technology and, more particularly, relates to transistors and fabrication techniques.

BACKGROUND

In order to follow the Moore's law, dual gate transistors have been developed by existing semiconductor technologies. In a dual gate transistor, a channel is surrounded by two gates. The electric current in a dual gate transistor may be doubly controlled, thus the operating speed may be enhanced, the size may be reduced, and the power consumption may be lowered.

FIG. 1 illustrates an existing dual gate transistor. The dual gate transistor includes a substrate having a semiconductor substrate 101, a buried isolator 102, a back gate layer 103, a back gate dielectric layer 104, and a single crystal semiconductor layer 105. The dual gate transistor also includes a top gate dielectric layer 107, a top gate 108, a capping layer 120, and a sidewall spacer 111. The semiconductor substrate 101, the buried isolator 102, the back gate layer 103, and the back gate dielectric layer 104 may form a back gate structure. The top gate dielectric 107, the top gate 108, the capping layer 120, and the sidewall spacer 111 may form a top gate structure.

With the continuous development of the transistor technology, performance requirements of transistors have been increasing, thus how to increase the electron mobility of the channel of a transistor may be an urgent task for the semiconductor industry. The disclosed methods and systems are directed to solve one or more problems set forth above and other problems.

BRIEF SUMMARY OF THE DISCLOSURE

One aspect of the present disclosure includes a method for fabricating a transistor. The method includes providing a semiconductor substrate, and forming a metal layer on the semiconductor substrate. The method also includes forming a silicon layer having at least one layer of graphene-like silicon on the metal layer, and forming a metal oxide layer by oxidizing a portion of the metal layer underneath the silicon layer. Further the method includes forming a source region and a drain region connecting with the silicon layer.

Another aspect of the present disclosure includes a transistor. The transistor includes a semiconductor substrate which is used as a gate of a back gate structure. The transistor also includes a metal layer which is used as a substrate for forming a silicon layer having at least one layer of graphene-like silicon layer, and a metal oxide layer. Further, the transistor includes the silicon layer having at least one layer of graphene-like silicon. Further, the transistor also includes a source region and a drain region connecting with the silicon layer, and a top gate structure having a top gate dielectric layer and a top gate layer. Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

A graphene-like silicon may refer to a two-dimensional single atom layer which is made of silicon atoms arranging with a hexagonal crystal lattice. The graphene-like silicon has a relatively high electron mobility. If the graphene-like silicon is used as a channel material in a transistor, the performance of the transistor may be significantly enhanced.

Figure 1:
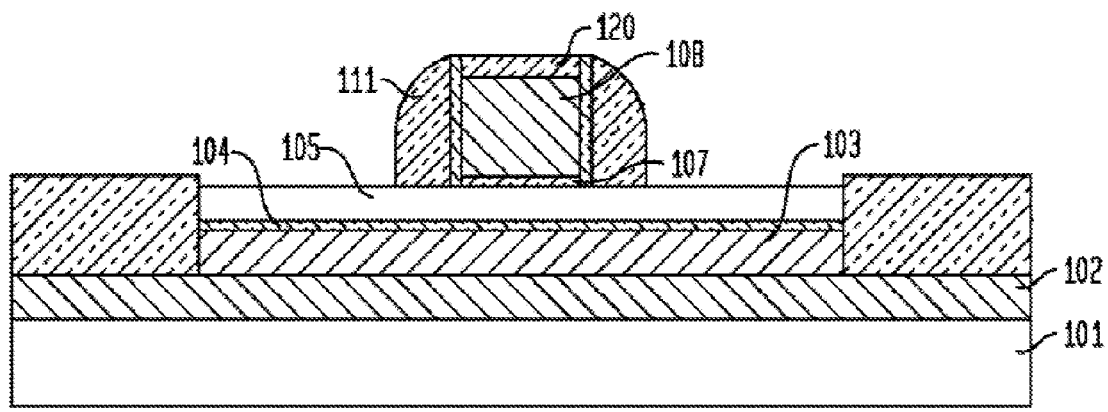
FIG. 1 illustrates an existing dual gate transistor.
Figure 2:
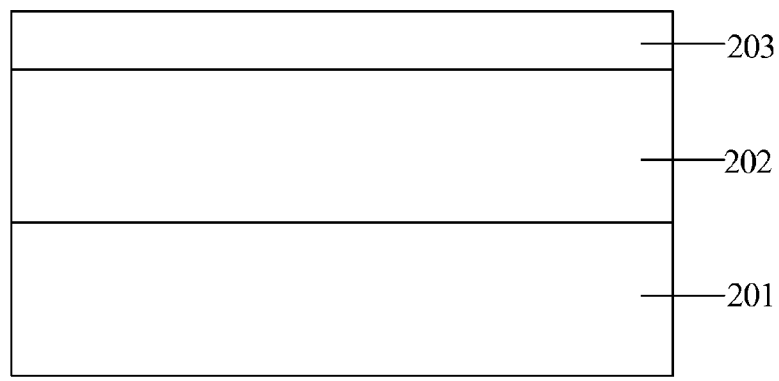
FIGS. 2-4 illustrate semiconductor structures corresponding to certain stages of an exemplary fabrication process for a transistor consistent with the disclosed embodiments.
Figure 3:
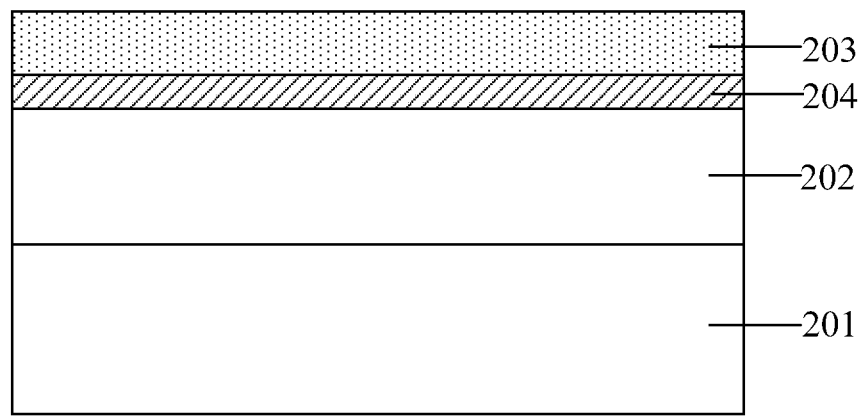
Figure 4:
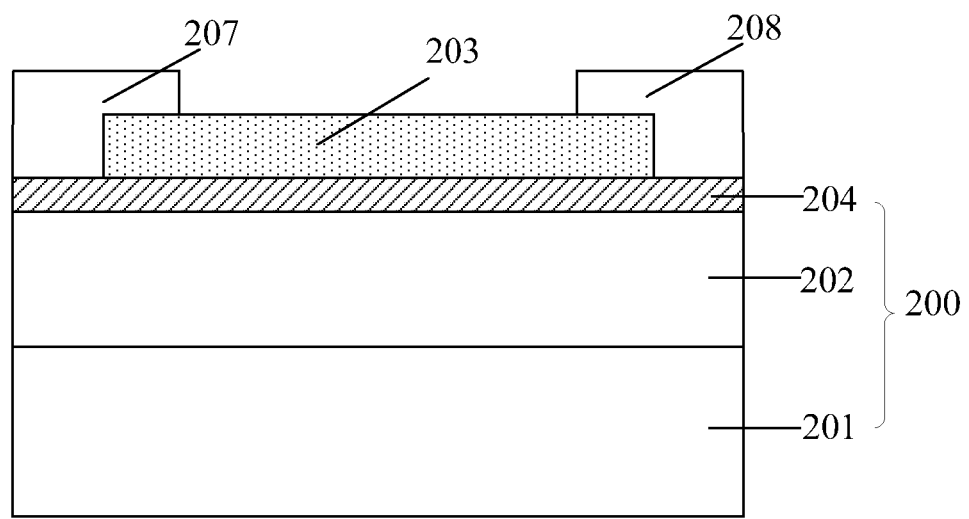
Figure 5:
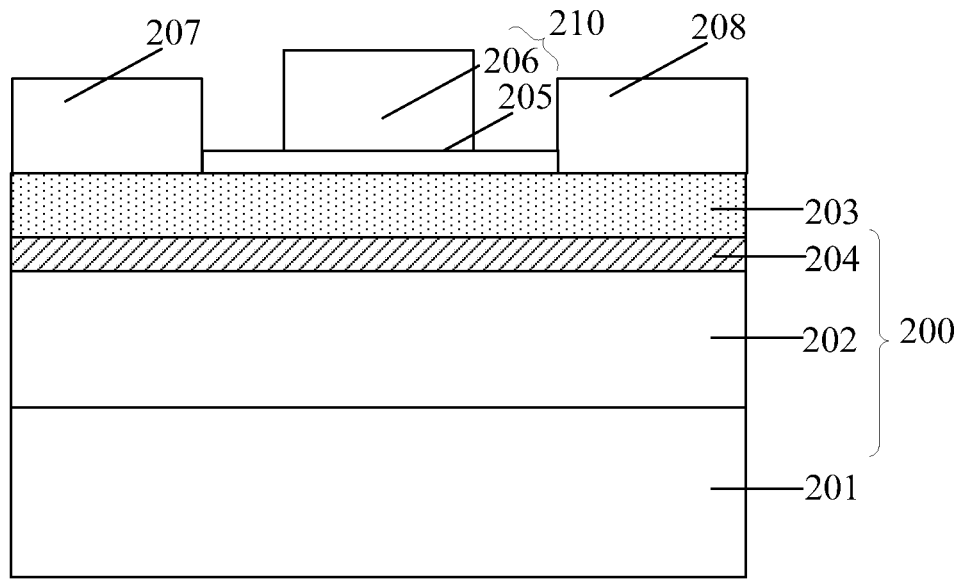
FIG. 5 illustrates a dual gate transistor consist with the disclosed embodiments.
Figure 6:
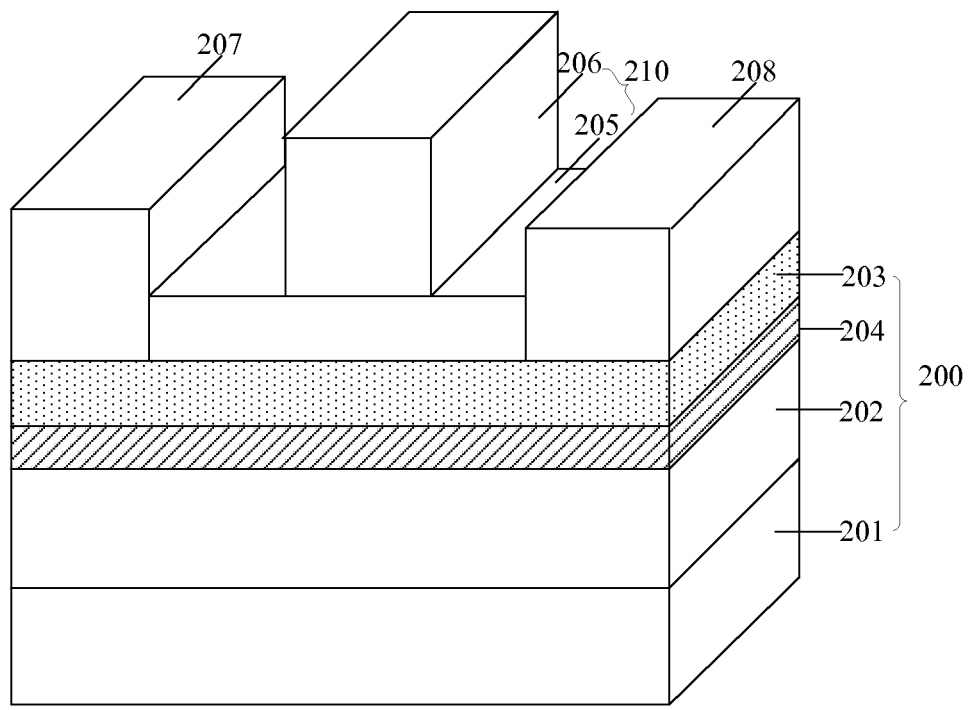
FIG. 6 illustrates a three dimensional structure of a dual gate transistor consistent with the disclosed embodiments.
Figure 7:
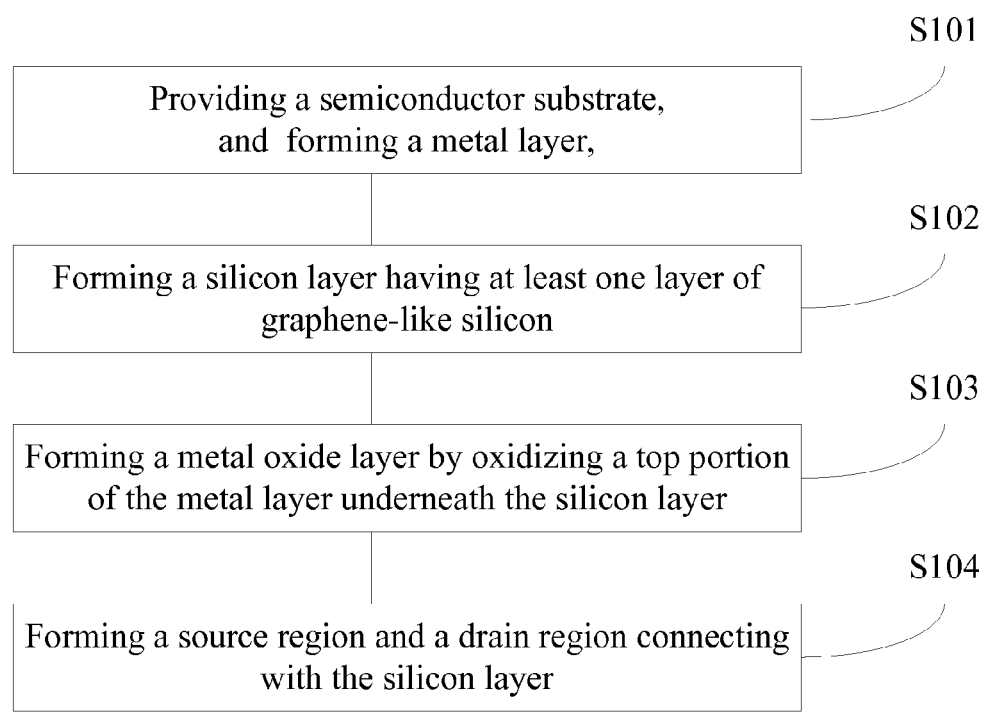
FIG. 7 illustrates an exemplary fabrication process for a transistor consistent with the disclosed embodiments.

FIG. 7 illustrates an exemplary fabrication process for a transistor with a graphene-like silicon channel consistent with the disclosed embodiments. FIGS. 2-4 illustrate semiconductor structures corresponding to certain stages of the exemplary fabrication process. FIG. 5 illustrates another semiconductor structure consistent with the disclosed embodiments. FIG. 6 illustrates a three-dimensional semiconductor structure consistent with the disclosed embodiment.

As shown in FIG. 7, at the beginning of the fabrication process, a semiconductor substrate with certain structures is provided (S101). FIG. 2 shows a corresponding semiconductor device.

As shown in FIG. 2, a semiconductor substrate 201 is provided. The semiconductor substrate 201 may include any appropriate type of semiconductor material, such as single crystal silicon, germanium, poly silicon, amorphous silicon, silicon germanium, carborundum, indium antimonide, lead telluride, indium arsenide, indium phosphide, gallium arsenide, gallium antimonide, alloy semiconductor, or epitaxially grown materials, etc. In one embodiment, the semiconductor substrate 201 is highly doped single crystalline silicon. The semiconductor substrate 201 may be used as a back gate. The semiconductor substrate 201 may also provide a base for subsequent processes and structures.

After providing the semiconductor substrate 201, a metal layer 202 may be formed on the semiconductor substrate 201. The metal layer 202 may be made of any appropriate material, such as silver, zinc, copper, or nickel, etc. In one embodiment, the metal layer 202 is silver. For illustrative purposes, silver may be used as the metal layer 202 throughout the entire application.

The silver layer 202 may be formed by a physical vapor deposition (PVD) process, such as a thermal evaporation process, an electron beam deposition process, a magnetron-sputtering process, or a pulse laser deposition process, etc.

The silver layer 202 may also be formed by a chemical vapor deposition process or a electroplating process. In one embodiment, the silver layer 202 is formed by a PVD process.

The silver layer 202 may be used as a substrate for subsequently forming a graphene-like silicon layer. A thickness of the silver layer 202 may be have impact on certain aspects of the semiconductor structure. If the thickness of the silver layer 202 is too small, it may be adverse for subsequently forming the graphene-like silicon layer. If the thickness of the silver layer 202 is too big, it may be easy to waste silver. In one embodiment, the thickness of the silver 202 may be in a range of approximately 50 nm~500 nm.

Returning to FIG. 7, after forming the silver layer 202, a silicon layer may be formed on the silver layer 202 (S102). A corresponding semiconductor structure is illustrated in FIG. 2.

As shown in FIG. 2, after forming the silver layer 202, a silicon layer 203 may be formed on the silver layer 202. The silicon layer 203 may have at least one layer of grapheme-like silicon which may refer to silicene. The silicon layer 203 may be just a single graphene-like silicon layer. The silicon layer 203 may also be a plurality of graphene-like silicon layers stacking together. The silicon layer 203 may be formed by any appropriate process, such as an atomic layer deposition (ALD) process, a metal organic deposition (MOCVD) process, a molecular beam epitaxy (MBE) process, a vapor-liquid-solid (VSL) process, a wet chemical process, etc.

Because the silicon layer 203 have at least one layer of graphene-like silicon may have a very high carrier mobility, a transistor using the silicon layer 203 as a channel material may have an enhanced carrier mobility, thus the performance of the transistor may be improved. In certain other embodiments, other appropriate graphene-like layers may also be used as a channel material of a transistor, such as doped hexagonal boron nitride, or doped molybdenum disulfide, etc.

Returning to FIG. 7, after forming the silicon layer 203, a silver oxide layer may be formed (S103). FIG. 3 illustrates a corresponding semiconductor structure.

As shown in FIG. 3, a silver oxide layer 204 is formed between the silicon layer 203 and the silver layer 202. The semiconductor substrate 201, the silver layer 202 and the silver oxide layer 203 may form a back gate structure 200. The silver oxide layer 204 may be formed by oxidizing a top portion of the silver layer 202 underneath the silicon layer 203. Specifically, the semiconductor substrate 201 with the silver layer 202 and the silicon layer 203 may be put in an oxygen environment. Silicon atoms in the silicon layer 203 may arrange as graphene-like hexagonal patterns, the silicon layer 203 may be rather loose. Therefore, oxygen atoms may penetrate through the silicon layer 203, and reach the silver layer 202. The oxygen atoms may react with the top portion of the silver layer 202, and form the silver oxide layer 204.

The oxidation process of the silver layer 202 is relatively fast, thus the efficiency of forming a transistor may be improved. Further, the oxidation process may be well compatible with existing semiconductor processes, it may be unnecessary to acquire new instrument, the production cost may be lowered. Other appropriate processes may also be used to oxidize the silver layer 202 to form the silver oxide layer 204, such as a wet chemical process, or an oxygen plasma process, etc.

A thickness of the silver oxide layer 204 may have impact on certain aspects of the semiconductor structure. If the thickness of the silver oxide layer 204 is too small, the silver oxide layer 204 may be unable to isolate a gate region consisting of the semiconductor substrate 201 and the silver layer 202 and a channel region made of the graphene-like silicon layer 203.

If the thickness of the silver oxide layer 204 is too big, silver may be wasted. In one embodiment, the thickness of the silver oxide layer 204 may be in a range of approximately 1 nm~2 nm. The thickness of the silver oxide layer may be controlled by parameters of the oxidation process, such as oxidation time, oxidation temperature, or flow of oxygen, etc.

Returning to FIG. 7, after forming the silver oxide layer 203, a source region and a drain region may be formed (S104). FIG. 4 illustrates a corresponding semiconductor structure.

As shown in FIG. 4, a source region 207 and a drain region 208 are formed to connect with the silicon layer 203. Thus a single gate transistor is formed. The source region 207 and the drain region 208 may be formed by a standard photo lithography process (may refer to a microfabrication process), or an electron beam lithography process (may refer to a nanofabrication process). The source region 207 and the drain region 208 may also be directly formed by a focused ion beam process. Other appropriate processes may also be used to form the source region 207 and the drain region 208.

The silicon layer 203 having at least one layer of graphene-like silicon may have a relatively high carrier mobility, thus the performance of the transistor having the silicon layer 203 as a channel material may be improved.

Thus, a back-gated transistor, may also refer to single gate transistor, may be formed.

In certain other embodiments, a top gate structure (not shown) may be formed on the silicon layer 203 to formed a top-gated single gate transistor. The top gate structure may include a gate dielectric layer on the silicon layer 203, and a gate layer on the gate dielectric layer.

In certain other embodiments, a top gate structure may be formed on the silicon layer 203 before forming the source region 207 and the drain region 208 to form a dual gate transistor. FIG. 5 illustrates a corresponding semiconductor structure, and FIG. 6 shows a three dimensional structure of the semiconductor structure shown in FIG. 5.

As shown in FIGS. 5-6, a top gate structure 210 is formed on the silicon layer 203. The top gate structure 210 may have a top gate dielectric layer 205 and a top gate layer 206. Further, a back gate structure 200 is already formed in the semiconductor structure, including the semiconductor substrate 201, the silver layer 202, and the silver oxide layer 203. After forming the top gate structure 210, a transistor with dual gates, e.g., the back gate structure 200 and the top gate structure 210, may be formed. That is, channel region (may refer to the graphene-like silicon layer 203) of the transistor may be controlled by both the back gate structure 200 and the top gate structure 210, the operating speed of the transistor may be increased, and the size of the transistor may be reduced.

Referring to FIG. 5, a process for forming the top gate structure 210 may include forming a top gate dielectric material layer on the silicon layer 203, and forming a top gate material layer on the top gate dielectric material layer. The process for forming the top gate structure 210 may also include patterning the top gate dielectric layer, and patterning the top gate material layer. Therefore, the top gate dielectric layer 205 is formed on the silicon layer 203, and the top gate layer 206 is formed on the top gate dielectric layer 205. The top gate dielectric layer 205 and the top gate layer 206 may form the top gate structure 210.

The top gate dielectric layer 206 may be a high-K material. The high-K material may be one or more of hafnium oxide, zirconium oxide, lanthanum oxide, aluminum oxide, titanium oxide, barium titanate, lanthanum aluminum oxide, yttrium oxide, hafnium oxynitride, zirconium oxynitride, lanthanum oxynitride, aluminum oxynitride, titanium oxynitride, barium strontium oxynitride, lanthanum aluminum oxy nitride and yttrium oxynitride. Other appropriate material may also be used to form the top gate dielectric layer 206.

Various processes may be used to form the top gate dielectric layer 206, such as a chemical vapor deposition (CVD) process, a physical vapor deposition (PVD) process, or an atomic layer deposition (ALD) process. In one embodiment, the top gate dielectric layer 206 is formed by an ALD process.

The top gate layer 206 may be made of one or more of tungsten, tantalum, vanadium, titanium nitride, zirconium nitride, hafnium nitride, vanadium nitride, niobium nitride, tantalum nitride, tungsten nitride, aluminum titanium nitride, tantalum carbide, tantalum magnesium nitride, and tantalum carbo-nitride. Various processes may be used to form the top gate layer 206, such as a CVD process, a PVD process, or an ALD process.

After forming the top gate structure 210, a source region 207 and a drain region 208 may be formed on the silicon layer 203 exposed at both sides of the top gate structure 206. The source region 207 and the drain region 208 may connect with the silicon layer 203.

When a transistor is functioning, a channel may be formed in the silicon layer 203 between the source region 207 and the drain region 208, because the silicon layer 203 having at least one layer of graphene-like silicon may have a relatively high carrier mobility, the performance of the transistor may be enhanced.

In certain other embodiments, the transistor may be controlled by only the top gate structure 210, thus the transistor may refer to a top-gated single gate transistor.

Thus, a transistor may be formed by the above disclosed processes and methods, the corresponding transistor is illustrated in FIG. 5. The transistor includes a semiconductor substrate 201 which is used as a gate of a back gate structure 200. The transistor also includes a silver layer 202 which is used as a substrate for forming the silicon layer 203, and a silver oxide layer 204. Further, the transistor includes the silicon layer 203 having at least one layer of graphene-like silicon. Further the transistor also includes a source region 207 and the drain region 208, and a top gate structure 210 having a top gate dielectric layer 205 and a top gate layer 206. The detailed structures and intermediate structures are described above with respect to the fabrication methods.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a transistor, comprising:
   providing a semiconductor substrate of highly doped silicon;
   forming a metal layer over the semiconductor substrate;
   forming a silicon layer on the metal layer, the silicon layer having at least one layer of graphene-like silicon formed by silicon atoms arranged in a hexagonal crystal lattice;
   forming a metal oxide layer underneath the silicon layer, after forming the silicon layer, by passing oxygen through the silicon atoms in the silicon layer to oxidize a top portion of the metal layer to form a metal oxide layer and a remaining metal layer;
   forming a source region and a drain region contacting on surface portions of the silicon layer; and
   after forming the source region and the drain region, forming a top gate structure on the silicon layer between the source region and the drain region, wherein the silicon layer under the top gate structure is used as a channel layer for the top gate structure, wherein:
   a back gate structure is provided by the semiconductor substrate of highly doped silicon as a back gate electrode, the remaining metal layer as a back gate metal layer, after the metal oxide layer is formed, and the metal oxide layer as a back gate dielectric layer, and
   the channel layer for the top gate structure is electrically controlled by both the top gate structure and the back gate structure.

2. The method according to claim 1, wherein:
   the metal layer comprises silver, and the metal oxide layer comprises silver oxide.

3. The method according to claim 2, wherein:
   a thickness of a silver oxide layer is in a range of approximately 1 nm-2 nm.

4. The method according to claim 2, wherein forming the silicon layer further includes:
   one of an atomic layer deposition (ALD) process, a metal organic chemical vapor deposition (MOCVD) process, a molecular beam epitaxy (MBE), a vapor-liquid-solid (VSL) process, and a wet chemical process.

5. The method according to claim 2, wherein:
   a silver layer is formed by a physical vapor deposition process.

6. The method according to claim 5, wherein:
   a thickness of the silver layer is in a range of approximately 50 nm-500 nm.

7. The method according to claim 1, wherein the step of forming the top gate structure includes:
   forming a top gate dielectric layer on the silicon layer, and
   forming a top gate layer on the top gate dielectric layer.

8. The method according to claim 7, wherein:
   the top gate dielectric layer comprises a high-K material layer comprising hafnium oxide, zirconium oxide, lanthanum oxide, aluminum oxide, titanium oxide, barium titanate, lanthanum aluminum oxide, yttrium oxide, hafnium oxynitride, zirconium oxynitride, lanthanum oxynitride, aluminum oxynitride, titanium oxynitride, barium strontium oxynitride, lanthanum aluminum oxy nitride, and yttrium oxynitride.

9. The method according to claim 8, wherein:
   the high-k layer is formed by an atomic layer deposition (ALD) process.

10. The method according to claim 7, wherein:
    the top gate layer comprises tungsten, tantalum, vanadium, titanium nitride, zirconium nitride, hafnium nitride, vanadium nitride, niobium nitride, tantalum nitride, tungsten nitride, aluminum titanium nitride, tantalum carbide, tantalum magnesium nitride, and tantalum carbo-nitride.

11. The method according to claim 10, wherein:
    the top gate layer is formed by a chemical vapor deposition process, a physical vapor deposition process, or an atomic layer deposition process.

12. The method according to claim 1, wherein:
    a portion of each of the source region and the drain region formed on the silicon layer is also formed on the metal oxide layer.

13. A transistor, comprising:
    a semiconductor substrate of highly doped silicon;
    a metal layer disposed over the semiconductor substrate;
    a metal oxide layer on the metal layer, wherein the semiconductor substrate of highly doped silicon is used as a back gate electrode, the metal layer is used as a back gate metal layer, and the metal oxide layer is used as a back gate dielectric layer of a back gate structure;

a silicon layer having at least a graphene-like silicon layer disposed on the metal oxide layer,
wherein the graphene-like silicon layer comprises silicon atoms arranged in a hexagonal crystal lattice, and
wherein the metal oxide layer underneath the silicon layer is an oxidation layer formed by oxidizing a top portion of the metal layer by passing oxygen through the silicon atoms of the silicon layer, after the silicon layer has been disposed on the metal layer;

a source region and a drain region contacting on surface portions of the silicon layer; and a top gate structure on the silicon layer between the source region and the drain region, wherein:

the silicon layer under the top gate structure is used as a channel layer for the top gate structure, and the channel layer for the top gate structure is electrically controlled by both the top gate structure and the back gate structure.

14. The transistor according to claim 13, wherein:
the metal layer comprises silver, and the metal oxide layer comprises sliver oxide.

15. The transistor according to claim 14, wherein:
a thickness of a silver oxide layer is in a range of approximately 1 nm-2 nm.

16. The transistor according to claim 14, wherein:
a thickness of a silver layer is in a range of approximately 50 nm-500 nm.

17. The transistor according to claim 13, wherein:
the top gate structure includes a top gate dielectric layer on the channel layer, and a top gate layer on the top gate dielectric layer.

18. The transistor according to claim 17, wherein:
the top gate dielectric layer comprises a high-K material layer comprising hafnium oxide, zirconium oxide, lanthanum oxide, aluminum oxide, titanium oxide, barium titanate, lanthanum aluminum oxide, yttrium oxide, hafnium oxynitride, zirconium oxynitride, lanthanum oxynitride, aluminum oxynitride, titanium oxynitride, barium strontium oxynitride, lanthanum aluminum oxy nitride, and yttrium oxynitride.

19. The transistor according to claim 17, wherein:
the top gate layer comprises tungsten, tantalum, vanadium, titanium nitride, zirconium nitride, hafnium nitride, vanadium nitride, niobium nitride, tantalum nitride, tungsten nitride, aluminum titanium nitride, tantalum carbide, tantalum magnesium nitride, and tantalum carbon-nitride.

20. The transistor according to claim 13, wherein:
a portion of each of the source region and the drain region formed on the silicon layer is also formed on the metal oxide layer.

* * * * *